United States Patent
Honda et al.

(10) Patent No.: US 8,303,834 B2
(45) Date of Patent: Nov. 6, 2012

(54) PLASMA PROCESSING APPARATUS AND PLASMA ETCHING METHOD

(75) Inventors: Masanobu Honda, Nirasaki (JP); Kenji Masuzawa, Nirasaki (JP); Hiroyuki Nakayama, Nirasaki (JP); Manabu Iwata, Nirasaki (JP); Manabu Sato, Boise, ID (US); Kazuki Narishige, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 378 days.

(21) Appl. No.: 12/411,953

(22) Filed: Mar. 26, 2009

(65) Prior Publication Data

US 2009/0242515 A1 Oct. 1, 2009

Related U.S. Application Data

(60) Provisional application No. 61/109,975, filed on Oct. 31, 2008.

(30) Foreign Application Priority Data

Mar. 27, 2008 (JP) .................................. 2008-083042

(51) Int. Cl.
  *B44C 1/22* (2006.01)
  *C03C 15/00* (2006.01)
  *C03C 25/68* (2006.01)
  *C23F 1/00* (2006.01)
(52) U.S. Cl. ................................ 216/67; 216/58; 216/63
(58) Field of Classification Search ......................... None
See application file for complete search history.

(56) References Cited

U.S. PATENT DOCUMENTS

| 2004/0035365 A1 | 2/2004 | Yamazawa et al. |
| 2006/0037701 A1* | 2/2006 | Koshiishi et al. ........ 156/345.44 |
| 2007/0221493 A1* | 9/2007 | Honda et al. ............... 204/192.1 |

FOREIGN PATENT DOCUMENTS

| CN | 1842244 A | 10/2006 |
| JP | 2004-96066 | 3/2004 |
| KR | 10-2006-0105668 | 10/2006 |
| KR | 10-2006-0105670 | 10/2006 |

OTHER PUBLICATIONS

Korean Office Action issued Jan. 18, 2011, in Patent Application No. 10-2009-0026118 (with partial English-language translation).

* cited by examiner

*Primary Examiner* — Duy Deo
*Assistant Examiner* — Bradford Gates
(74) *Attorney, Agent, or Firm* — Oblon, Spivak, McClelland, Maier & Neustadt, L.L.P.

(57) ABSTRACT

A plasma processing apparatus includes an inner upper electrode provided to face a lower electrode mounting thereon a substrate, an outer upper electrode provided in a ring shape at a radially outside of the inner upper electrode and electrically isolated from the inner upper electrode in a vacuum evacuable processing chamber and a processing gas supply unit for supplying a processing gas into a processing space between the inner and the outer upper electrode and the lower electrode. A radio frequency (RF) power supply unit is also provide to apply a RF power to the lower electrode or the inner and the outer upper electrode to generate a plasma of the processing gas by RF discharge. A first and a second DC power supply unit are provided to apply a first and a second variable DC voltage to the inner upper electrode, respectively.

12 Claims, 11 Drawing Sheets

FIG. 13

| | 0/0V | | 0/400V | | 0/900V | |
|---|---|---|---|---|---|---|
| CENTER | NECK CD (nm) | 53 | — | 54 | — | 62 | — |
| | BOTTOM CD (nm) | 57 | 69 | 57 | 69 | 67 | 66 |
| EDGE | NECK CD (nm) | 62 | — | 63 | — | 62 | — |
| | BOTTOM CD (nm) | 67 | 66 | 66 | 69 | 67 | 68 |

PLASMA PROCESSING APPARATUS AND PLASMA ETCHING METHOD

FIELD OF THE INVENTION

The present invention relates to a technique for performing a plasma process on a substrate to be processed; and, more particularly, to a capacitively coupled plasma processing apparatus and a plasma etching method using same.

BACKGROUND OF THE INVENTION

In a manufacturing process of a semiconductor device or an FPD (Flat Panel Display), a plasma is often used in the process, e.g., etching, deposition, oxidation, sputtering or the like, in order to allow a processing gas to react efficiently at a relatively low temperature. Conventionally, a capacitively coupled plasma processing apparatus is mainly used to easily realize a plasma having a large diameter for single-wafer plasma processing apparatuses.

In general, the capacitively coupled plasma etching apparatus has a configuration in which an upper electrode and a lower electrode are disposed in parallel to each other in a vacuum processing chamber. A substrate to be processed (a semiconductor wafer, a glass substrate, or the like) is mounted on the lower electrode while a radio frequency (RF) power is applied between both electrodes. Then, electrons accelerated by an RF electric field formed between the electrodes, secondary electrons emitted from the electrodes, or heated electrons collide with molecules of the processing gas to ionize them to thereby generate plasma of the processing gas, and accordingly, a desired micro-processing, e.g., an etching process, is performed on the substrate surface by radicals or ions in the plasma.

In the plasma etching apparatus, there is widely used a lower electrode dual frequency application type in which a first RF power having a relatively high frequency (normally 40 MHz or higher) appropriate for plasma generation (RF discharge) and a second RF power having a relatively low frequency (normally 13.56 MHz or lower) appropriate for ion attraction (bias) are applied to the lower electrode at the same time.

In the capacitively coupled plasma processing apparatus which realize the plasma having the large diameter, however, it has been difficult to carry out the plasma process uniformly on every position on the substrate, and this problem has been an obstacle to the enhancement of production yield.

Generally, in the plasma processing apparatus, a plasma density distribution inside the chamber tends to easily change depending on process parameters (pressure, RF power, kind of gas, and the like). Thus, although a highly uniform process result is obtained under a certain processing condition, the uniformity may be deteriorated if a processing condition is changed to obtain required processing characteristics. In fact, it is difficult to implement a chamber structure which guarantees high process uniformity under a wide range of processing conditions. Especially, in case of etching multilayer films on a substrate in plural steps consecutively, it is difficult to obtain the process uniformity with fine etching characteristics in every step because process parameters or materials of etching masks employed in each step or for each film to be processed are different.

In that regard, a conventional method of controlling an impedance of an electrode in an electric circuit to vary the plasma density distribution (see, e.g., Japanese Patent Laid-open Application No. 2004-96066 corresponding to U.S. Patent Application Publication No. 2004/0035365 A1) is not an active control method. Thus, it has been difficult to be dealt with various processes or variations in processing conditions flexibly, so that recently required high level of plasma process uniformity could not be achieved.

SUMMARY OF THE INVENTION

In view of the above, the present invention provides a capacitively coupled plasma processing apparatus capable of controlling a distribution characteristic of an electron density or process characteristics on a substrate to be processed easily and arbitrarily.

The present invention also provides a plasma etching method capable of improving uniformity of etching characteristics in various etching processes.

In accordance with an aspect of the present invention, there is provided a plasma processing apparatus including: a vacuum evacuable processing chamber; a lower electrode for mounting a substrate thereon in the processing chamber; an inner upper electrode provided in the processing chamber to face the lower electrode; an outer upper electrode provided in a ring shape at a radially outside of the inner upper electrode in the processing chamber and electrically isolated from the inner upper electrode; a processing gas supply unit for supplying a processing gas into a processing space between the inner and the outer upper electrode and the lower electrode; an radio frequency (RF) power supply unit for applying an RF power to the lower electrode or the inner and the outer upper electrode to generate a plasma of the processing gas by RF discharge; a first DC power supply unit for applying a first variable DC voltage to the inner upper electrode; and a second DC power supply unit for applying a second variable DC voltage to the outer upper electrode.

In this configuration, by varying the first variable DC voltage applied to the inner upper electrode from the first DC power supply unit and the second variable DC voltage applied to the outer upper electrode from the second DC power supply unit independently, it is possible to control an electron density distribution or process characteristics on the substrate mounted on the lower electrode. Further, by combining the two variable DC voltages appropriately, process uniformity can be improved.

The first and the second DC power supply unit may have individual DC power supplies. Alternatively, the first and the second DC power supply unit may have a common DC power supply, and the first DC power supply unit includes a variable resistor to produce a voltage drop, connected between an output terminal of the common DC power supply and the inner upper electrode.

Further, the outer upper electrode may be protruded toward the lower electrode more than the inner upper electrode.

Preferably, the plasma processing apparatus may further include an additional RF power supply unit for applying an additional RF power to the lower electrode to attract ions in the plasma towards the substrate.

In accordance with another aspect of the present invention, there is provided a plasma etching method for performing an etching process on a Si-containing insulating film by using the plasma processing apparatus described above, wherein both of the first and the second variable DC voltage may not be greater than 0V, and the magnitude of the second variable DC voltage may be equal to or greater than the magnitude of the first variable DC voltage.

The insulating film may be an $SiO_2$ film. In the etching process of forming a contact hole in the $SiO_2$ film, the first variable DC voltage may be set in the range from about $-600$ V to $-150$ V, and the second variable DC voltage may be set in the range from about −1000 V to −150 V. Moreover, the frequency of the additional RF power may be set to range from about 2 MHz to 3.2 MHz. By varying the second variable DC voltage, an etching rate at a substrate edge portion can be effectively altered while hardly changing an etching rate at a substrate central portion. As a result, uniformity of etching rate can be improved.

The insulating film may be a SiOC film. In the etching process of forming a via hole in the SiOC film, the first variable DC voltage may be set in the range from about −900 V to −300 V, and the second variable DC voltage may be set in the range from about −1500 V to −300 V. The frequency of the additional RF power may be set to range from about 10 MHz to 13.56 MHz. Further, the processing gas may be an etching gas containing a fluorocarbon gas; an inert gas; and one of an $O_2$ gas and an $N_2$ gas. By varying the second variable DC voltage, the etching rate at the substrate edge portion can be effectively altered while hardly changing the etching rate at the substrate central portion. As a result, the uniformity of etching rate can be improved.

The insulating film may be a SiN film used as an intermediate or a lower most layer in a multilayer resist process. In the etching process to transfer a mask pattern on the SiN film, the first variable DC voltage may be set in the range from about −300 V to 0 V; and the second variable DC voltage is set in the range from about −900 V to −300 V. The frequency of the additional RF power may be set to range from about 10 MHz to 13.56 MHz.

In this case, by varying the second variable DC voltage, the etching rate at the substrate edge portion can be effectively altered while hardly changing the etching rate at the substrate central portion, and also, a pattern CD shift can also be varied at the substrate edge portion more effectively than at the substrate central portion. As a result, uniformity of CD can be improved.

In accordance with still another aspect of the present invention, there is provided a plasma etching method for etching an organic film by using the plasma processing apparatus described above, wherein both of the first and the second variable DC voltage may not be greater than 0V, and the magnitude of the second variable DC voltage may be equal to or greater than the magnitude of the first variable DC voltage. The first variable DC voltage may be set in the range from about −100 V to 0 V, and the second variable DC voltage may be set in the range from about −900 V to 0 V. The frequency of the additional RF power may be set to range from about 10 MHz to 13.56 MHz. Further, the processing gas may be an etching gas containing an $O_2$ gas or an $N_2$ gas. In this case, by varying the second variable DC voltage, the etching rate at the substrate edge portion can be effectively altered while hardly changing the etching rate at the substrate central portion. As a result, the uniformity of etching rate can be further improved.

BRIEF DESCRIPTION OF THE DRAWINGS

The objects and features of the present invention will become apparent from the following description of embodiments given in conjunction with the accompanying drawings, in which:

FIG. 13 presents a cross sectional view (SEM photograph) showing a pattern shape obtained as a result of etching an antireflection film (BARC) and the organic film contained in the multilayer resist shown in FIGS. 10A to 10D;

DETAILED DESCRIPTION OF THE EMBODIMENTS

Hereinafter, embodiments of the present invention will be described with reference to the accompanying drawings which form a part hereof.

Figure 1:
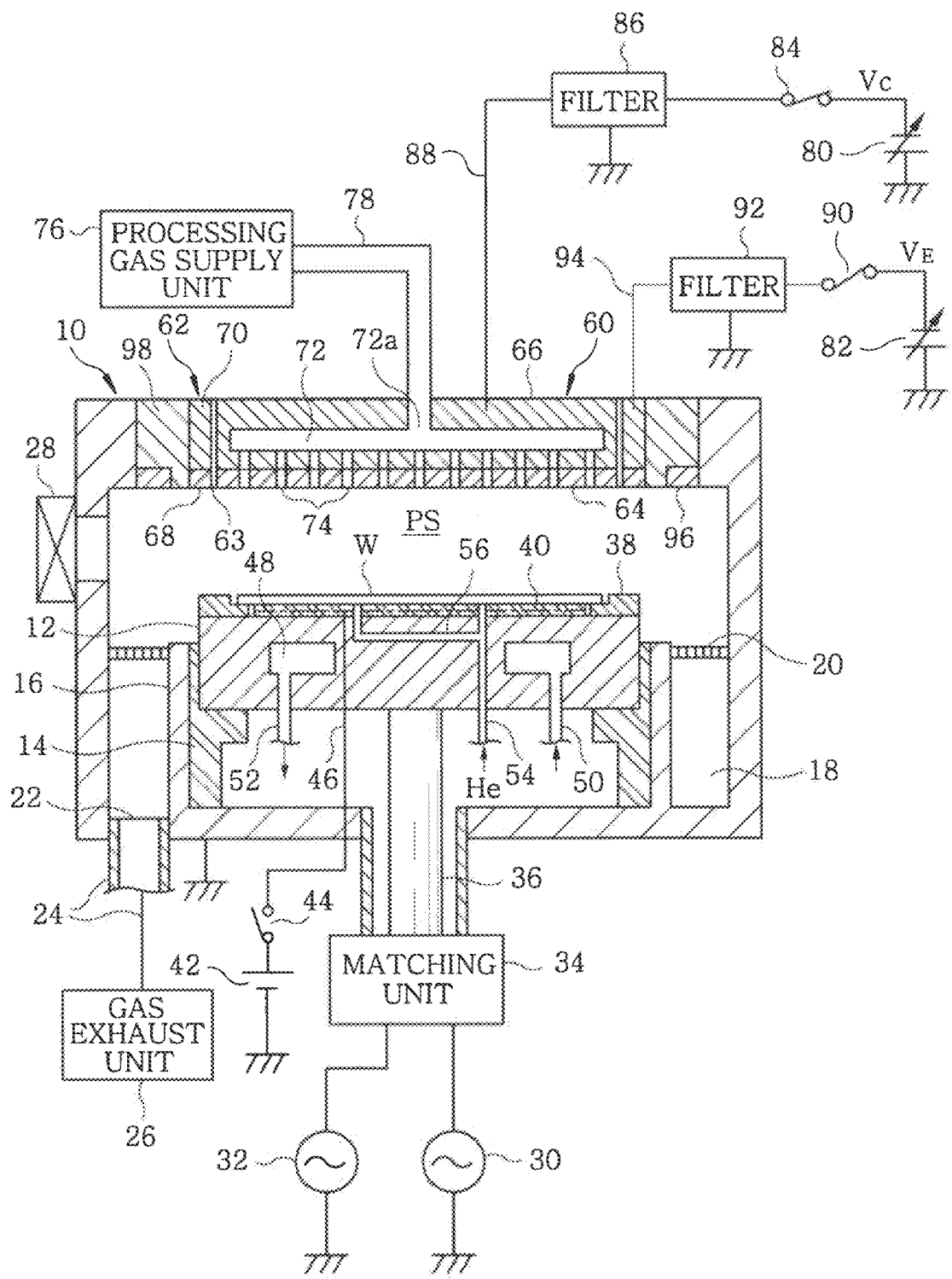
FIG. 1 is a longitudinal cross sectional view illustrating a configuration of a capacitively coupled plasma etching apparatus in accordance with an embodiment of the present invention.

FIG. 1 illustrates a configuration of a plasma etching apparatus in accordance with an embodiment of the present invention. The plasma etching apparatus is configured as a capacitively coupled plasma etching apparatus of a cathode coupling type employing a lower electrode dual frequency application type. The plasma etching apparatus includes a cylindrical chamber (processing chamber) 10 made of a metal such as aluminum, stainless steel, or the like. The chamber 10 is frame-grounded.

A circular plate-shaped susceptor 12 serving as a lower electrode for mounting thereon a substrate to be processed, e.g., a semiconductor wafer W, is disposed horizontally in the chamber 10. The susceptor 12 is made of, e.g., aluminum, and is supported by a cylindrical insulating support 14 extending vertically upward from a bottom of the chamber 10.

An annular gas exhaust path 18 is formed between a sidewall of the chamber 10 and a cylindrical conductive support (inner wall portion) 16 extending vertically upward from the bottom of the chamber 10 along the outer periphery of the cylindrical support 14. A ring-shaped baffle plate (gas exhaust ring) 20 is attached at an entrance of the gas exhaust path 18, and a gas exhaust port 22 is formed at a bottom of the gas exhaust path 18. A gas exhaust unit 26 is connected to the gas exhaust port 22 via a gas exhaust pipe 24. The gas exhaust unit 26 includes a vacuum pump such as a turbo molecular pump or the like, so that a processing space in the chamber 10 can be depressurized to a desired vacuum level. A gate valve 28 for opening and closing a loading/unloading port for the semiconductor wafer W is attached to the sidewall of the chamber 10.

A first and a second radio frequency (RF) power supply 30 and 32 are electrically connected to the susceptor 12 via a matching unit 34 and a power feed rod 36. Here, the first RF power supply 30 outputs a first RF power of a predetermined frequency (normally 40 MHz or higher), which mainly contributes to plasma generation. Meanwhile, the second RF power supply 32 outputs a second RF power of a predetermined frequency (normally 13.56 MHz or lower), which mainly contributes to ion attraction towards the semiconductor wafer W on the susceptor 12. The matching unit 34 includes a first matching device for matching an impedance of the first RF power supply 30 with that of the loads (mainly, the electrode, the plasma and the chamber) and a second matching device for matching an impedance of the second RF power supply 32 with that of the loads.

The semiconductor wafer W is mounted on a top surface of the susceptor 12A, and a focus ring (modification ring) 38 is disposed to surround the semiconductor wafer W. The focus ring 38 is formed of such a conductive material, e.g., Si, SiC, or the like which exerts minimal adverse influence on a process, and is detachably attached to the top surface of the susceptor 12 as an expendable part.

An electrostatic chuck 40 for adsorbing and holding the wafer is disposed on the top surface of the susceptor 12. The electrostatic chuck 40 is formed by embedding a sheet-shaped or mesh-shaped conductor in a film-shaped or plate-shaped dielectric. The conductor is electrically connected to a DC power supply 42 via an on/off switch 44 and a power feed line 46 disposed outside the chamber 10. The semiconductor wafer W can be adsorbed to be held on the electrostatic chuck 40 by a Coulomb force generated by a DC voltage applied from the DC power supply 42.

Installed in the susceptor 12 is an annular coolant path 48 extended, e.g., in a circumferential direction. A coolant of a predetermined temperature, e.g., cooling water, from a chiller unit (not shown) is circulated in the coolant path 48 via lines 50 and 52. Thus, the temperature of the semiconductor wafer W on the electrostatic chuck 40 can be controlled by the temperature of the coolant.

Moreover, in order to accurately control the wafer temperature, a thermally conductive gas, e.g., a He gas, is supplied from a thermally conductive gas supply unit (not shown) to a space between the electrostatic chuck 40 and the semiconductor wafer W via a gas supply line 54 and a gas path 56 formed in the susceptor 12.

A disk-shaped inner (or central) upper electrode 60 and a ring-shaped outer (or peripheral) upper electrode 62 are concentrically disposed at the ceiling of the chamber 10 so as to face the susceptor 12 in parallel. The inner upper electrode 60 may preferably have a diameter approximately equal to that of the semiconductor wafer W, and the outer upper electrode 62 may preferably have inner and outer diameters approximately equal to those of the focus ring (modification ring) 38. The inner upper electrode 60 and the outer upper electrode 62 are electrically (more precisely, in a DC manner) insulated from each other. In the illustrated example, a ring-shaped insulator 63 made of, e.g., ceramic, is inserted between the two electrodes 60 and 62.

The inner upper electrode 60 includes an electrode plate 64 straightly facing the susceptor 12 and an electrode support 66 detachably supporting the electrode plate 62 from a back (upper) side thereof. The material for forming the electrode plate 64 is desirably a silicon-containing conductive material such as Si, SiC or the like having minimal adverse influence on the process and capable of maintaining a fine DC application characteristic. The electrode support 66 may be formed of alumite-processed aluminum.

The outer upper electrode 62 also includes an electrode plate 68 facing the susceptor 12 and an electrode support 70 detachably supporting the electrode plate 62 from a back (upper) side thereof. The electrode plate 68 and the electrode support 70 may be formed of the same materials as used for the electrode plate 64 and the electrode support 66, respectively.

In the present embodiment, the inner upper electrode 60 also serves as a shower head for supplying a processing gas into a processing space PS formed between the upper electrodes 60 and 62 and the susceptor 12. Specifically, a gas diffusion space 72 is provided inside the electrode support 66, and a plurality of gas injection openings 74 extending from the gas diffusion chamber 66 toward the susceptor 12 are formed in the electrode support 66 and the electrode plate 64. A gas inlet port 72a provided at a top portion of the gas diffusion space 72 is connected to a gas supply pipe 78 extended from a processing gas supply unit 76. Further, the outer upper electrode 62 as well as the inner upper electrode 60 may serve as a shower head.

Disposed outside the chamber 10 are two variable DC power supplies 80 and 82 capable of respectively outputting variable DC voltages $V_C$ and $V_E$ in the range, e.g., from about −2000 to +1000 V. In a plasma etching method in accordance with the present invention, each of the DC voltages $V_C$ and $V_E$ typically has a value not greater than 0 V, i.e., a negative value, and they are used together while a relationship $|V_C| \leq |V_E|$ is maintained between their magnitudes $|V_C|$ and $|V_E|$.

An output terminal of one variable DC power supply 80 is electrically connected to the inner upper electrode 60 via an on/off switch 84 and a filter circuit 86. The filter circuit 86 serves to allow a first DC voltage $V_C$ outputted from the variable DC power supply 80 to pass therethrough to be applied to the inner upper electrode 60. Further, the filter circuit 86 serves to prevent an RF power flowing through the DC power feed line 88 from the susceptor 12 via the processing space PS and the inner upper electrode 60 from flowing into a ground line without letting it flow toward the variable DC power supply 80.

An output terminal of another variable DC power supply 82 is electrically connected with the outer upper electrode 62 via an on/off switch 90 and a filter circuit 92. The filter circuit 92 serves to allow a second DC voltage $V_E$ outputted from the variable DC power supply 82 to pass therethrough to be applied to the outer upper electrode 62. Further, the filter circuit 92 serves to prevent an RF power flowing through the DC power feed line 94 from the susceptor 12 via the processing space PS and the outer upper electrode 62 from flowing into a ground line without letting it flow toward the variable DC power supply 82.

A ring-shaped DC ground component (DC ground electrode) 96 made of a conductive member such as Si, SiC, or the like is disposed at a proper position facing the processing space PS inside the chamber 10, e.g., at a radially outside of the outer upper electrode 62. The DC ground component 96 is attached to a ring-shaped insulator 98 made of, e.g., ceramic and is also connected to the ceiling wall of the chamber 10 to be grounded all the time via the chamber 10. If the DC voltages $V_C$ and $V_E$ are applied to the upper electrodes 60 and 62 from the variable DC power supplies 80 and 82 during a plasma process, a DC electron current flows between the upper electrodes 60 and 62 and the DC ground component through a plasma.

The operation of each of respective components arranged in the plasma etching apparatus, e.g., the gas exhaust unit 26, the RF power supplies 30 and 32, the on/off switch 44 for the electrostatic chuck, the processing gas supply unit 76, the on/off switches 84 and 90 for the DC application, the chiller unit (not shown), a thermally conductive gas supply unit (not shown) and so forth and the entire operation (sequence) of the apparatus are controlled by a controller (not shown) having a microcomputer (not shown).

To perform an etching process in the plasma etching apparatus configured as described above, a gate valve 28 is first opened, and a semiconductor wafer W to be processed is loaded into the chamber 10 and mounted on the electrostatic chuck 40. Then, an etching gas (generally a gaseous mixture) is introduced from the processing gas supply unit 76 into the chamber 10 at a predetermined flow rate, and the internal pressure of the chamber 10 is regulated to a pre-set value by using the gas exhaust unit 26. Further, the first and the second RF power supply 30 and 32 are turned on, and each of a first RF power (equal to or higher than about 40 MHz) and a second RF power (equal to or lower than about 13.56 MHz) is outputted at a predetermined power level and is applied to the susceptor 12 via the matching unit 34 and the power feed rod 36. Further, the switch 44 is also turned on so that a thermally conductive gas (He gas) can be confined in an interfacial contact surface between the electrostatic chuck 40 and the semiconductor wafer W. The etching gas injected through the shower head 60 is turned to plasma by RF discharge between the opposite electrodes 12 and 60, and a film to be processed on the surface of the semiconductor wafer W is etched into a desired pattern by radicals or ions which are generated in the plasma.

With the capacitively coupled plasma etching apparatus, the first RF power of relatively high frequency, i.e., 40 MHz or higher, suitable for the plasma generation is applied to the susceptor 12. This makes it possible to increase the density of plasma in a desirable dissociation state and to form high-density plasma even at a lower pressure condition. At the same time, the second RF power of relatively low frequency, i.e., 13.56 MHz or lower, suitable for the ion attraction is applied to the susceptor 12, anisotropic etching can be performed with a high selectivity for the film to be processed on the semiconductor wafer W. While the first RF power for plasma generation is always used in all plasma processes, the second RF power for the ion attraction may or may not be used depending on a process.

The main feature of the above-described capacitively coupled plasma etching apparatus lies in the configuration that the upper electrode is divided in two parts, the inner upper electrode 60 and the outer upper electrode 62, in a radial direction, and the first and the second DC voltage $V_C$ and $V_E$ are concurrently applied to the two upper electrodes 60 and 62 from the two variable DC power supplies 80 and 82, respectively. By appropriately selecting the combination of these two DC voltages $V_C$ and $V_E$, uniformity of the plasma process or etching characteristics can be improved in various applications. Examples of etching methods performed by using the above-described plasma etching apparatus will now be explained.

As an etching process of an insulating film containing Si, there is well-known an application of HARC (High Aspect Ratio Contact) for forming a narrow and deep contact hole in an $SiO_2$ film or an SiOC film or BEOL (Back End Of Line) for forming a comparatively shallow via hole therein.

Figure 2:
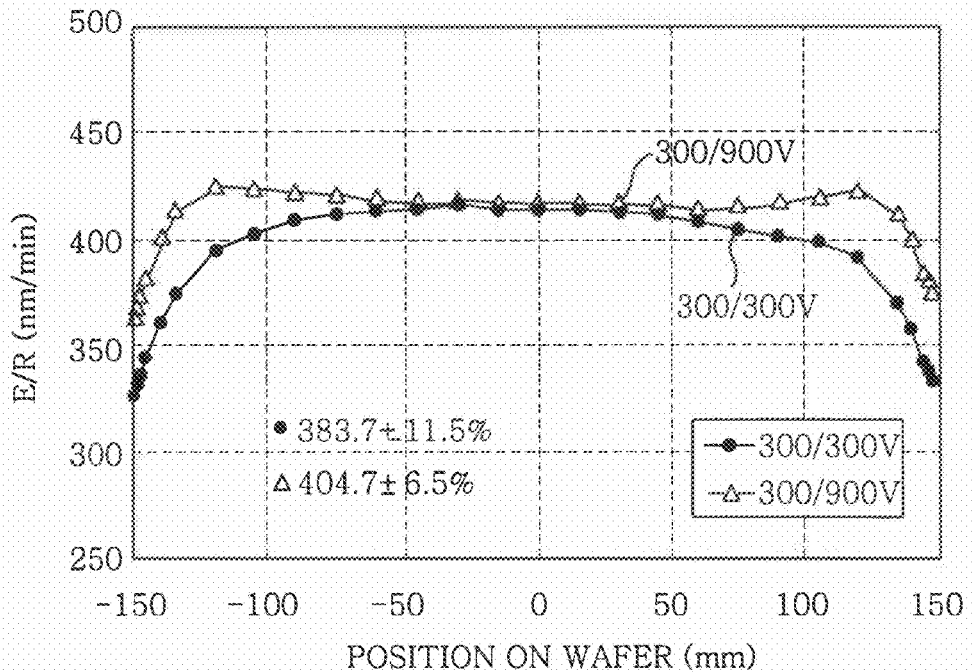
FIG. 2 sets forth a chart showing an in-plane distribution characteristic of an etching rate (E/R) obtained in an experiment for performing an etching process on the entire surface of an $SiO_2$ film in accordance with the embodiment of the present invention.

FIG. 2 illustrates an in-plane distribution characteristic of an etching rate E/R obtained in an experiment in which the entire surface of an $SiO_2$ blanket film is etched by using the etching apparatus in accordance with the embodiment of the present invention. Major etching conditions were as follows.

Wafer diameter: 300 mm
Etching gas: $C_4F_8$/Ar/$O_2$=45/200/30 sccm
Internal pressure of chamber: 15 mTorr
RF power: 40 MHz/2 MHz=1000/3000 W
Temperature: upper electrode/chamber sidewall/lower electrode=60/60/20° C.
DC voltage: $V_C$=−300 V,
$V_E$=−300 V, −900 V (two levels)

Figure 3:
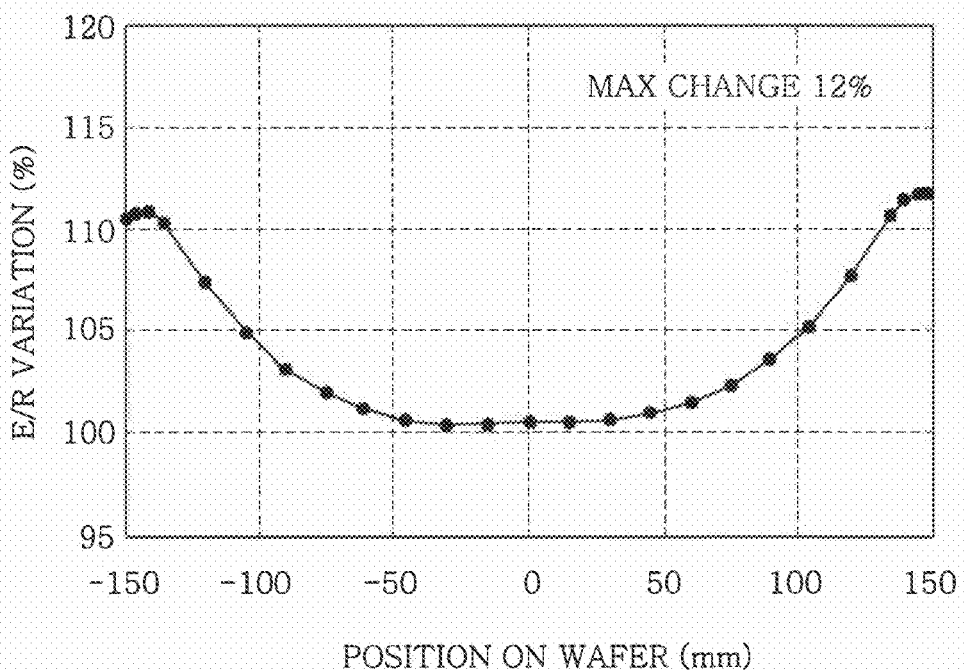
FIG. 3 depicts a chart showing an in-plane distribution characteristic of an E/R variation obtained when the value of a second DC voltage applied to an outer upper electrode is changed in the etching process shown in FIG. 2.

Further, FIG. 3 shows an E/R variation at each position on the wafer when the second DC voltage $V_E$ is changed from −300 V to −900 V.

As shown in FIG. 2, the E/R on the wafer rapidly decreases at an edge portion in comparison with the E/R at a central portion in case that $V_C$/$V_E$=−300 V/−300 V. In case that $V_C$/$V_E$=−300 V/−900 V, however, the difference between the central portion and the edge portion is reduced, so that the in-plane uniformity is increased considerably. Here, it is noted that the E/R of the central portion hardly changes, whereas the E/R of the edge portion changes greatly, as illustrated in FIG. 3.

Accordingly, by varying the second DC voltage $V_E$ applied to the outer upper electrode 62 within an appropriate range (preferably, in a range from about −1500 V to −300 V) while fixing the first DC voltage $V_C$ applied to the inner upper electrode 60 at an appropriate value (preferably, in a range from about −600 V to −150 V), the in-plane distribution characteristic of E/R can be freely controlled, and the in-plane uniformity can also be improved easily.

Since BEOL etching is the similar process to the etching of the $SiO_2$ blanket film, the above-described plasma etching method can be employed in the same way. Further, instead of the $O_2$ gas, an $N_2$ gas may be used as an additive gas of the etching gas used for the etching of the Si-containing insulating film.

Figure 4:
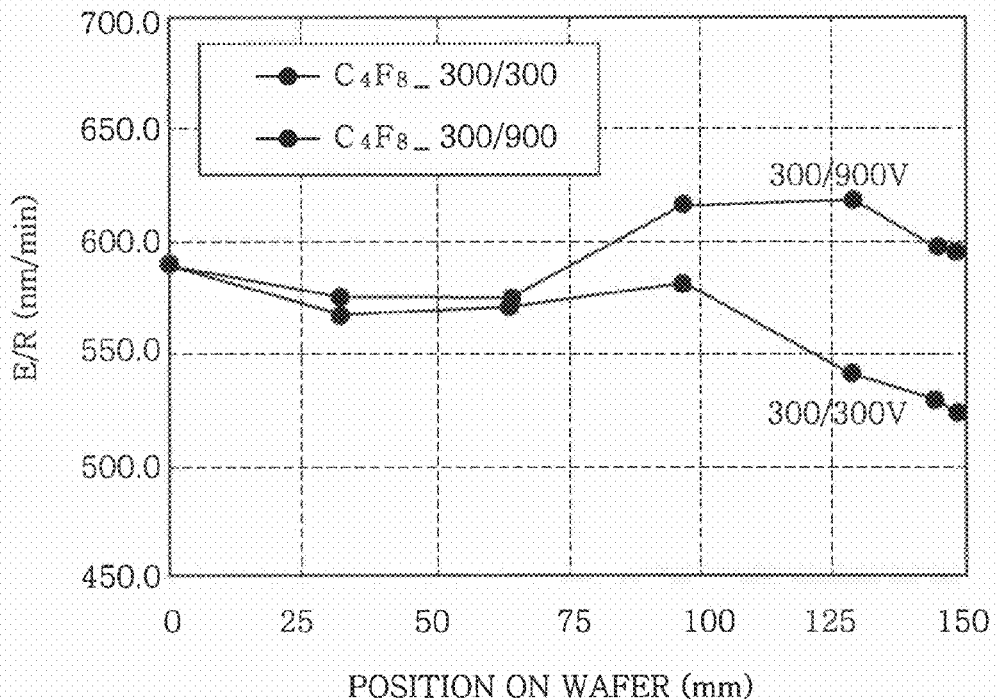
FIG. 4 offers a chart showing an in-plane distribution characteristic of an etching rate (E/R) obtained in an experiment of HARC etching for forming a contact hole in an $SiO_2$ film in accordance with the embodiment of the present invention.
Figure 5:
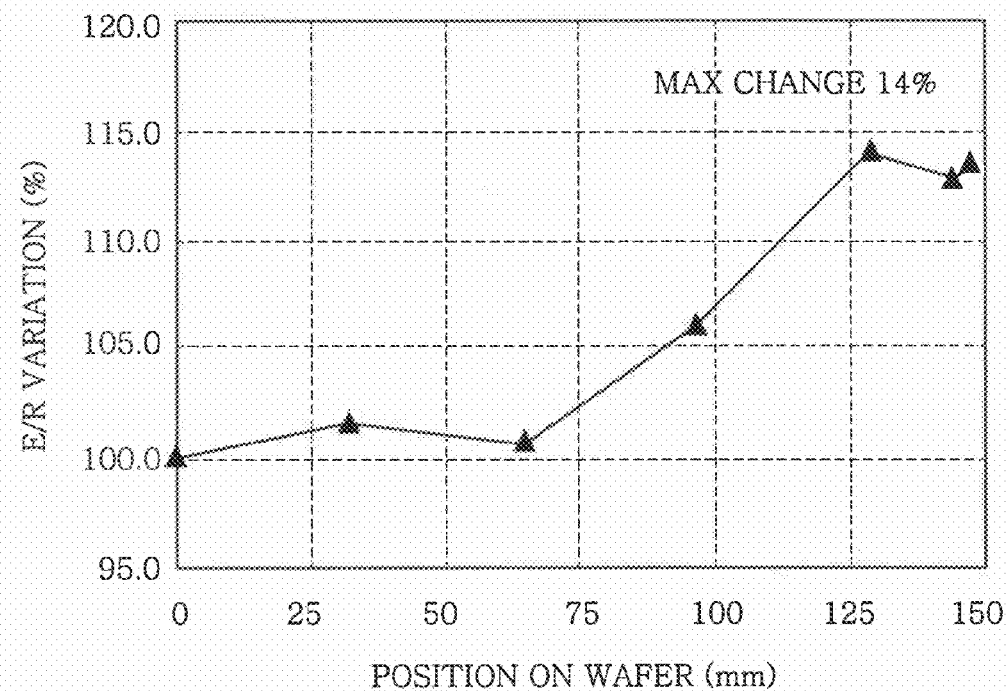
FIG. 5 presents a chart showing an in-plane distribution characteristic of an E/R variation obtained when the value of a second DC voltage applied to an outer upper electrode is changed in the etching process of FIG. 4.

FIG. 4 illustrates an in-plane distribution characteristic of an etching rate E/R obtained in a HARC etching experiment in which a contact hole having a diameter of about 0.25 μm in an $SiO_2$ film by using the etching apparatus in accordance with the embodiment of the present invention. Major etching conditions were the same as those conditions for the etching of the $SiO_2$ blanket film, and the second DC voltage $V_E$ was set to be about −300 V and −900 V, respectively. FIG. 5 shows an E/R variation at each position on the wafer when the second DC voltage $V_E$ is changed from −300 V to −900 V.

As can be seen from FIGS. 4 and 5, the similar characteristics as obtained in the etching of the $SiO_2$ blanket film were also acquired in the HARC. That is, it is found that by varying the second DC voltage $V_E$ applied to the outer upper electrode 62 in the range from about −900 V to −300 V while setting the first DC voltage $V_C$ applied to the inner upper electrode 60 to an appropriate value (e.g., about −300 V), an E/R of an edge portion can be varied while an E/R of a central portion is hardly changed, so that an E/R distribution profile in which the edge portion is lower than the central portion, a profile in which the central portion and the edge portion becomes substantially flat (uniform) and a profile in which the edge portion becomes higher than the central portion can be all achieved easily.

Figure 6:
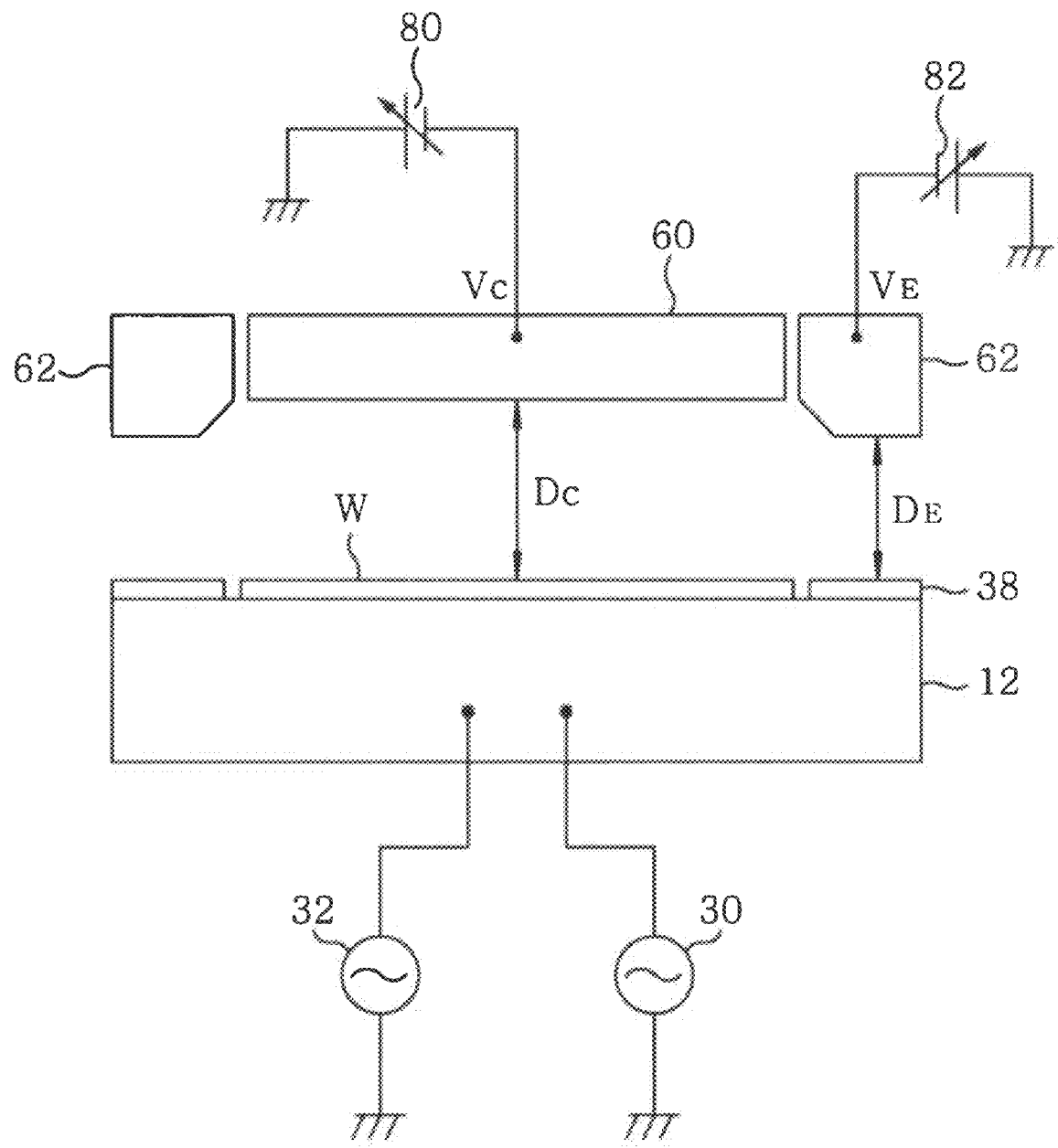
FIG. 6 provides a diagram illustrating a configuration in which a height difference is provided between an inner upper electrode and the outer upper electrode along an electrode gap direction in the plasma etching apparatus in accordance with the embodiment of the present invention.

In the plasma etching apparatus in accordance with the present embodiment, it is possible to provide a height difference between the inner upper electrode 60 and the outer upper electrode 62 along an electrode gap direction. Preferably, the outer upper electrode 62 may be protruded toward the lower electrode more than the inner upper electrode 60, as illustrated in FIG. 6. In FIG. 6, a gap $D_C$ between the inner upper electrode 60 and the semiconductor wafer W on the susceptor 12 may be set to be, e.g., about 30 cm, and a gap $D_E$ between the outer upper electrode 62 and the focus ring 38 on the susceptor 12 may be set to be, e.g., about 20 to 25 cm.

Figure 7:
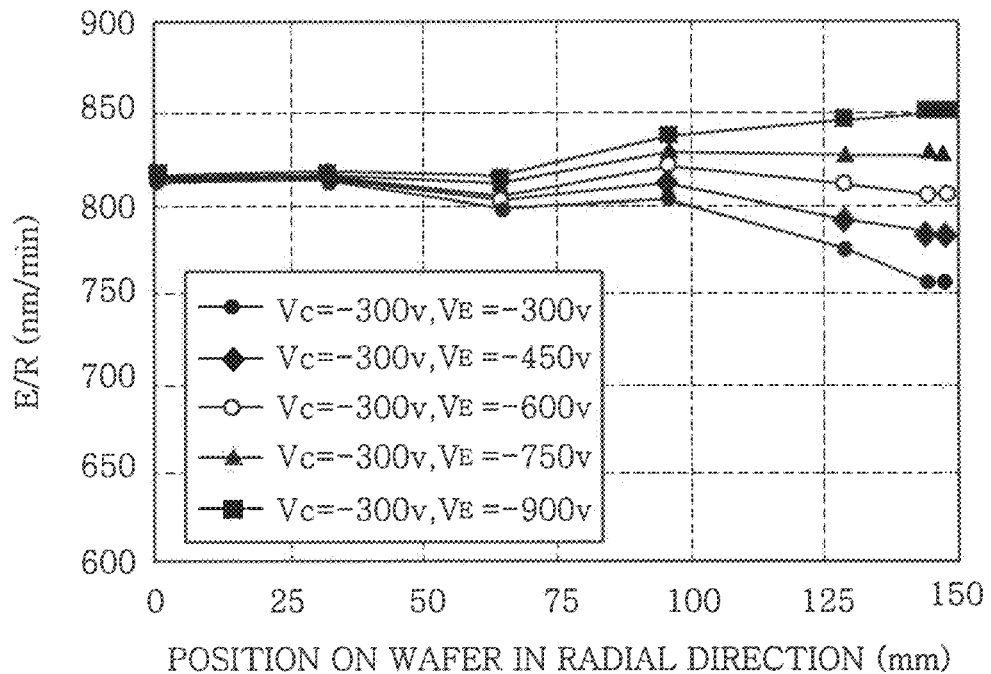
FIG. 7 provides a chart showing an in-plane distribution characteristic of an etching rate (E/R) obtained in an experiment of HARC etching using the electrode structure shown in FIG. 6.

FIG. 7 provides a result (E/R distribution characteristic) of an experiment in which the present invention is applied to HARC under the same etching conditions as specified above by using the plasma etching apparatus having a stepped electrode gap structure shown in FIG. 6. The experiment result shows that in-plane uniformity of E/R could be improved up to about ±0.9% under the condition of $V_C$=−300 V and $V_E$=−600 V.

Furthermore, in the application of the present invention to the HARC, the first DC voltage $V_C$ can be set in the range from about −600 V to −150 V and the second DC voltage $V_E$ can be set in the range from about −1000 V to −150 V under the condition that the relationship of $|V_C| \leq |V_E|$ is maintained. Moreover, in an etching process for forming a contact hole, the second RF power applied to the susceptor 12 is preferably set to be of a low frequency level to implant ions into a film to be processed strongly, and it may be set to about 2 MHz to 3.2 MHz, preferably.

In the etching of the Si-containing film, the profile of the E/R distribution characteristic on the semiconductor wafer W can be controlled by varying the value of second DC voltage $V_E$ because the distribution characteristic of electron density Ne on the semiconductor wafer W can be changed by varying the second DC voltage $V_E$ and there is a correlation between the distribution characteristic of the Ne and the E/R.

Figure 8:
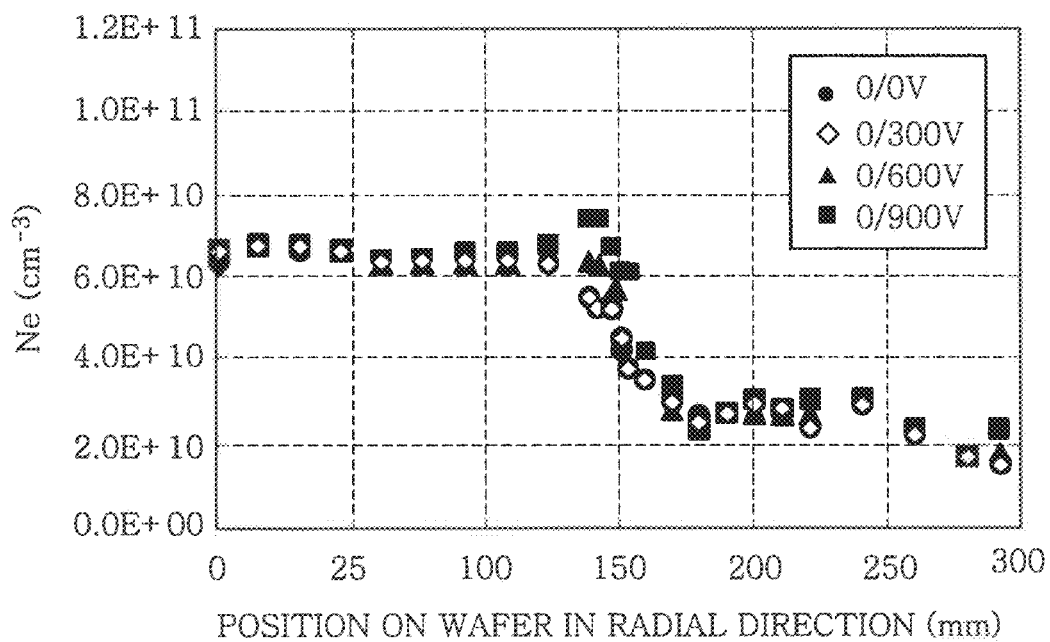
FIG. 8 sets forth a chart showing an in-plane distribution characteristic of an electron density (Ne) obtained in an experiment of HARC etching process in accordance with the embodiment of the present invention.
Figure 9:
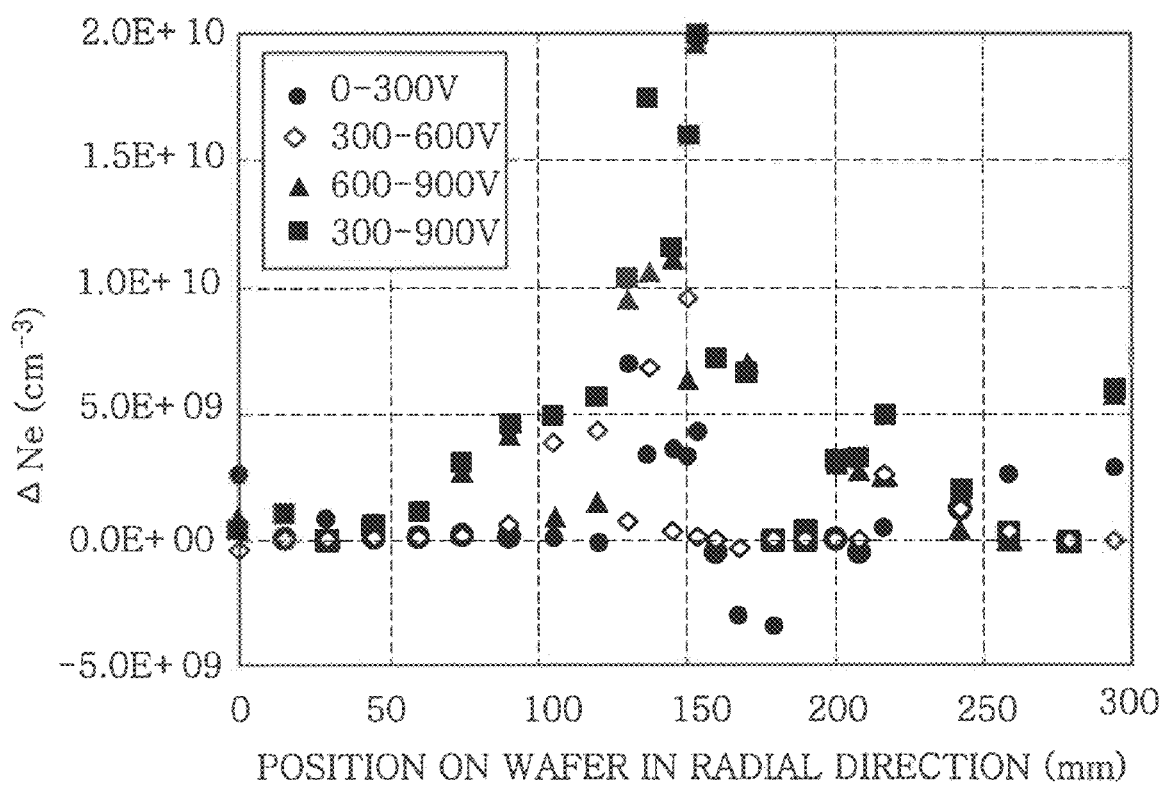
FIG. 9 is a chart showing an in-plane distribution characteristic of an Ne variation obtained when the value of a second DC voltage applied to the outer upper electrode is changed in the etching process shown in FIG. 8.

As an example, FIGS. 8 and 9 respectively show an Ne distribution characteristic and an Ne variation distribution characteristic obtained when the second DC voltage $V_E$ is varied in the above-described HARC etching. As can be seen from the charts, in case that the magnitude of the second DC voltage $V_E$ is increased from 0 V to 300 V, 600 V and 900 V, Ne at a wafer peripheral portion greatly increases while Ne at a wafer center portion is changed only slightly. Thus, it can be confirmed that the Ne distribution characteristic is correlated with the E/R distribution characteristic.

The plasma etching apparatus and method in accordance with the present invention can be preferably applied to the application for etching multilayer films on a substrate surface in plural steps consecutively. Hereinafter, an embodiment of a multilayer resist process as illustrated in FIGS. 10A to 10D will be explained.

As shown in FIGS. 10A to 10D, on a main surface of a semiconductor wafer W to be processed, an SiN layer 102 is formed on a film to be processed (e.g., an Si film for a gate) 100 as a lowermost layer (final mask); and an organic film (e.g., carbon) 104 is formed on the SiN layer 102 as an intermediate layer; and a photoresist 108 is formed on the organic film 104 as an uppermost layer via a Si-containing bottom antireflection coating (BARC) 106. Coating films by CVD (Chemical Vapor Deposition) or a spin-on process are used for the formation of the SiN layer 102, the organic film 104 and the BARC 106, and photolithography is employed for the patterning of the photoresist 108.

Figure 10D:
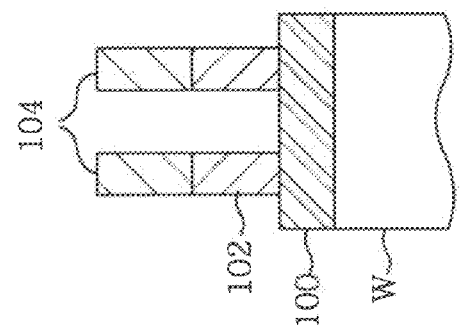
FIGS. 10A to 10D illustrate process sequences of a multilayer resist method in accordance with the embodiment of the present invention.
Figure 10C:
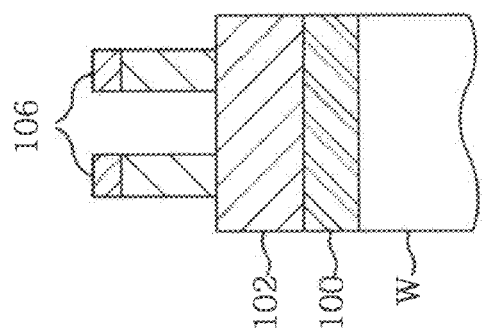
Figure 10B:
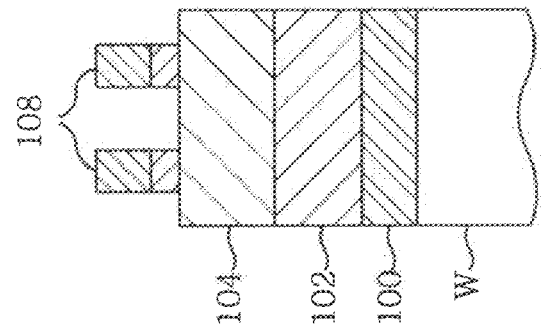
Figure 10A:
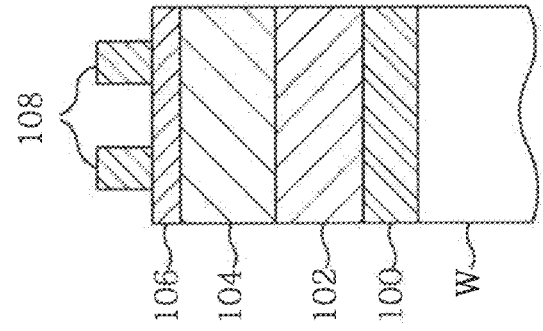

First, the Si-containing BARC 106 was etched by using the patterned photoresist 108 as a mask, as illustrated in FIG. 10A. Major etching conditions were as follows.
  Wafer diameter: 300 mm
  Etching gas: $CF_4/O_2$=250/13 sccm
  Internal pressure of chamber: 30 mTorr
  RF power: 40 MHz/13 MHz=400/0 W
  DC voltage: $V_C$=0 V, $V_E$=0 V, −300 V, −600 V (three levels)

Although not shown, the in-plane distribution characteristic of etching rate can be altered by varying the magnitude of the second DC voltage $V_E$ when etching the BARC 106.

Then, the organic film 104 was etched by using the photoresist 108 and the BARC 106 as a mask, as shown in FIG. 10B. Major etching conditions were as follows.
  Wafer diameter: 300 mm
  Etching gas: $O_2$=750 sccm
  Internal pressure of chamber: 20 mTorr
  Temperature: upper electrode/chamber sidewall/lower electrode=150/150/30° C.
  RF power: 40 MHz/13 MHz=400/200 W
  DC voltage: $V_C$=0 V, $V_E$=0 V, −300 V, −600 V (three levels)

Figure 11:
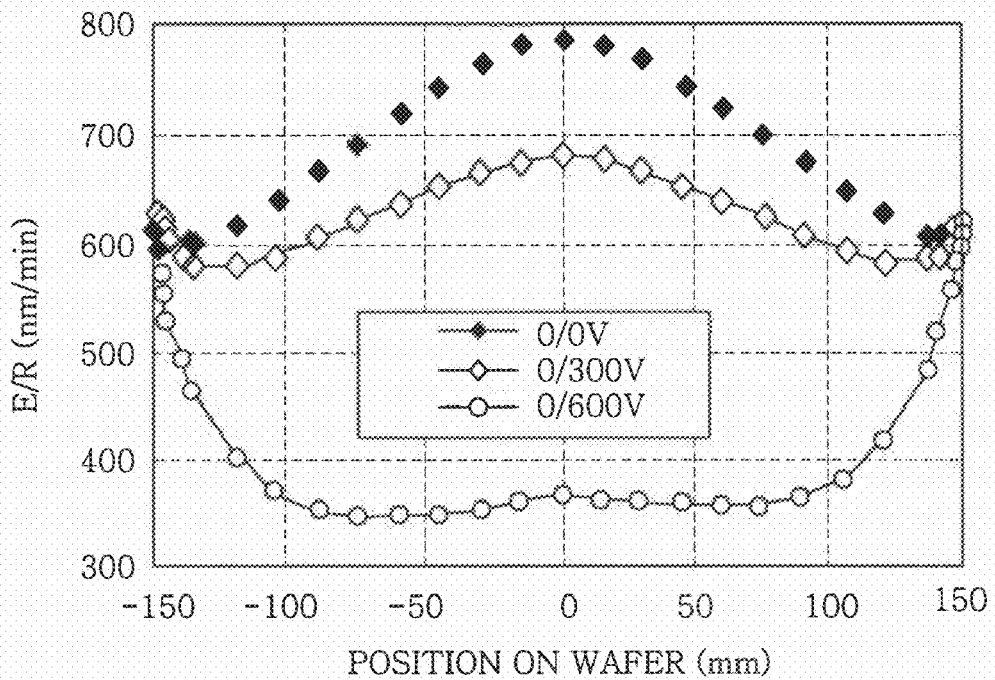
FIG. 11 is a chart showing an in-plane distribution characteristic of an etching rate (E/R) obtained as a result of etching an organic film contained in a multilayer resist of FIGS. 10A and 10D.
Figure 12:
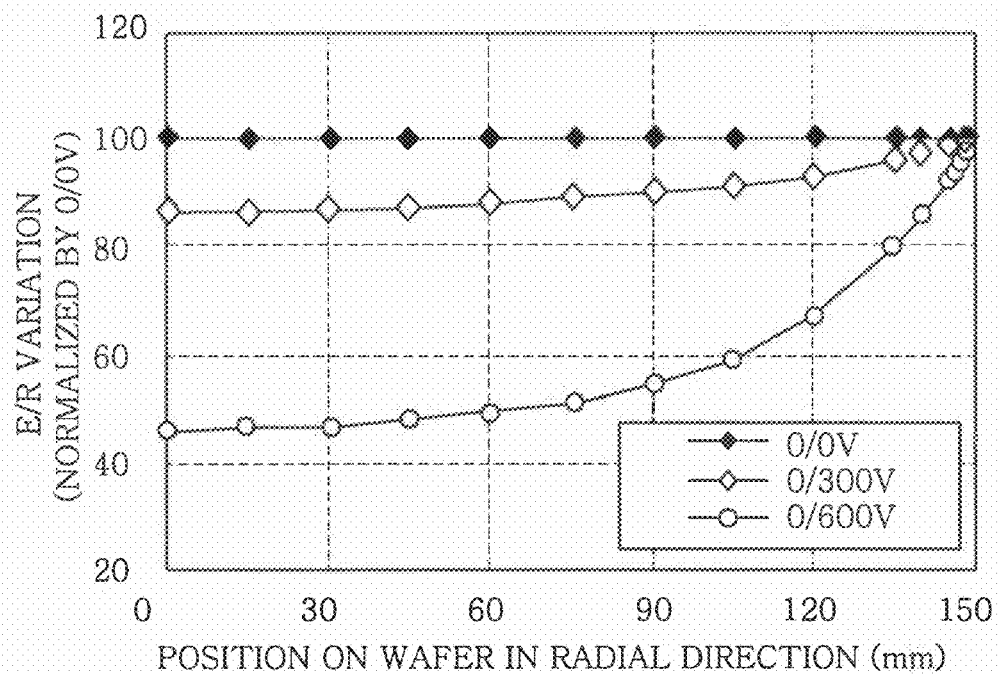
FIG. 12 depicts a chart showing an in-plane distribution characteristic of an E/R variation obtained when the value of a second DC voltage applied to the outer upper electrode is changed in the etching process shown in FIG. 8.

FIG. 11 shows an in-plane distribution characteristic of an etching rate E/R obtained by etching the organic film 104, and FIG. 12 indicates an in-plane distribution characteristic of an E/R variation.

As shown in FIG. 11, in the etching of the organic film, if the magnitude of the negative second DC voltage $V_E$ applied to the outer upper electrode 62 is varied while the first DC voltage $V_C$ applied to the inner upper electrode 60 is fixed at a certain value (0 V), an E/R of a wafer edge portion is maintained approximately constant, and when $V_E$=0 V, $V_E$=−300 V, $V_E$=−600 V, a steeply slopped mountain-like profile in which the E/R sharply increases at a wafer central portion, a gently sloped low-mountain like profile in which the E/R gently increases at the wafer central portion, and a pan-bottom shaped profile in which the E/R greatly decreases at the wafer central portion are obtained, respectively. Thus, it can be conjectured that an approximately flat E/R profile can be obtained between $V_E$=−600 V and $V_E$=−300 V (around −400 V).

As described above, in the application of an embodiment of the present invention to the etching of the organic film, the E/R of the wafer peripheral portion hardly changes but the E/R of the wafer central portion varies if the magnitude of the second DC voltage $V_E$ is altered, which is a different result from the etching of the Si-containing insulating film. The principle (operation) concerned with this phenomenon is not clearly known, but it is speculated that interaction between plasma (oxygen plasma) and the upper electrodes 60 and 62 may exert more dominant influence on the E/R distribution characteristic than influence according to the distribution characteristic of the electron density Ne.

Further, in the etching of the organic film in accordance with the present invention, the first DC voltage $V_C$ may be selected in the range from about −100 V to 0 V, while the second DC voltage $V_E$ may be selected in the range from about −900 V to 0 V. Moreover, in case where the accuracy of patterning shapes is important, the frequency of the second RF power may be selected in a slightly higher range (preferably, about 10 MHz to 13.56 MHz) to slightly reduce ion attraction energy. A gas containing an $O_2$ gas and an additive gas such as an $N_2$ gas, CO, COS, $H_2$, $NH_3$ or the like may be used as an etching gas. Examples of such gas combination can be as follows:

$O_2$, $O_2/N_2$, $O_2/CO$, $O_2/SO_2$, $O_2/COS$, $O_2/NH_3$, $N_2/H_2$, $NH_3$, $N_2/H_2/O_2$.

FIG. 13 provides a cross sectional view (SEM photograph) of patterns obtained by etching the BARC 106 and the organic film 104. As can be seen from the figure, it is found that a shoulder rounding 106' of the BARC 106 at an upper pattern portion decreases as the magnitude of the second Dc voltage $V_E$ is increased from 0 V to 400 V and further to 900 V, resulting in improvement of pattern verticality. This effect is observed more obviously in a sparse pattern portion (right side) than in a dense pattern portion (left side). Further, it is also observed that the accuracy and the uniformity of pattern CD (Critical dimension) are changed in a wafer's radial direction (in the central portion and the edge portion) if the magnitude of the second DC voltage $V_E$ is varied. It is also found that the accuracy and the uniformity of CD are improved as the $V_E$ is increased from 0V to 400 V and further to 900 V.

Referring to FIGS. 10C and 10D, the SiN film 102 was etched by using the patterned BARC 106 and the patterned organic film 104 as a mask. Major etching conditions were as follows.

Wafer diameter: 300 mm
Etching gas: $CHF_3/CF_4/Ar/O_2$=125/225/600/60 sccm
Internal pressure of chamber: 75 mTorr
Temperature: upper electrode/chamber sidewall/lower electrode=150/150/30° C.
RF power: 40 MHz/13 MHz=0/1000 W
DC voltage: $V_C$=−300 V, $V_E$=0 V, −300 V, −900 V (three levels)

Figure 14:
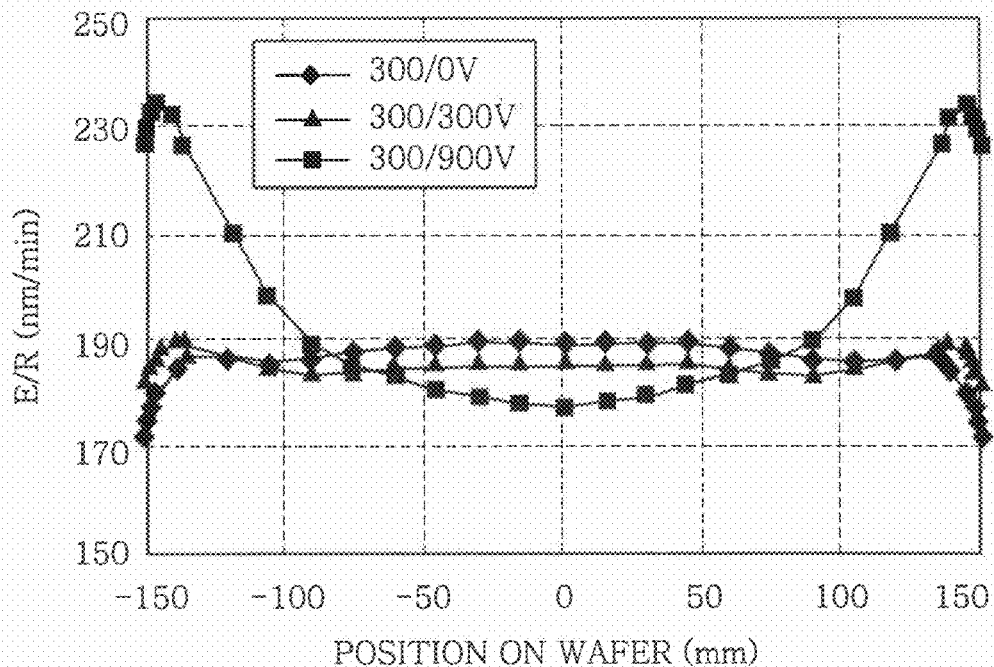
FIG. 14 offers a chart showing an in-plane distribution characteristic of an etching rate (E/R) obtained as a result of etching an SiN film contained in the multilayer resist shown in FIGS. 10A to 10D.

FIG. 14 shows an in-plane distribution characteristic of an etching rate E/R obtained by etching the SiN film 102. As shown therein, if the magnitude of the second DC voltage $V_E$ is increased from 0 V to 300 V and further to 900 V while the first DC voltage $V_C$ is maintained at a constant value (−300 V), an E/R of the wafer peripheral portion varies greatly while an E/R of the wafer central portion remains rarely changed. This result is the same as that obtained in the above-stated HARC or BEOL.

Figure 15:
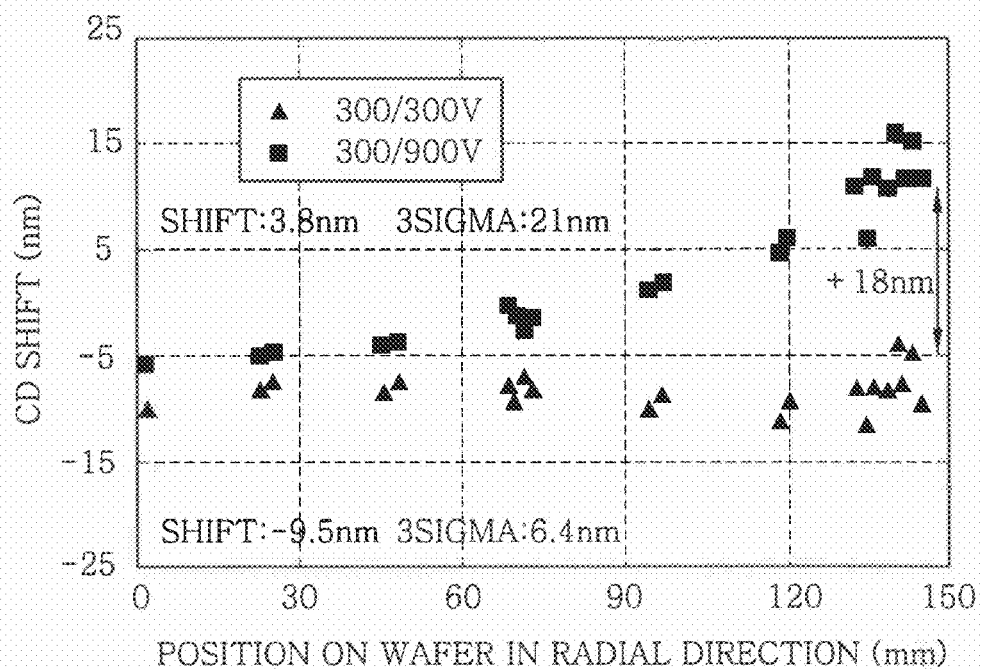
FIG. 15 is a chart showing an in-plane distribution characteristic of a CD shift obtained when the value of a second DC voltage applied to the outer upper electrode is changed in the etching process of FIG. 8.

Then, as illustrated in FIG. 15, if the magnitude of the second DC voltage $V_E$ is changed from 300 V to 900 V, a pattern CD shift changes more greatly in the wafer peripheral (edge) portion than in the wafer central portion. Thus, by varying the value of the second DC voltage $V_E$ appropriately, the uniformity and accuracy of CD of each semiconductor wafer can be improved, and, besides, pattern transfer accuracy can also be enhanced in the multilayer resist process.

In the etching of the SiN film in accordance with the present invention, the first DC voltage $V_C$ may be selected in the range from about −300 V to 0 V, while the second DC voltage $V_E$ may be determined in the range from about −900 V to −300 V. Moreover, since high-density pattern etching performed by radicals is required in the etching of the SiN film as well, it is preferable to lower the ion attraction energy, and the frequency of the second RF power may be selected in a slightly higher range (preferably, about 10 MHz to 13.56 MHz).

Although the embodiment of the present invention has been described so far, the present invention is not limited thereto but may be variously modified. Especially, various selections and modifications may be made for the configuration around the inner upper electrode 60 and the outer upper electrode 62 in the plasma etching apparatus in accordance with the present invention.

For example, it may be possible to set up a configuration in which the first and the second DC voltage $V_C$ and $V_E$ are individually applied to the inner and the outer upper electrode 60 and 62 by using a single or common variable DC power supply. For example, in a configuration example shown in FIG. 16, an output terminal of a variable DC power supply 110 is connected to the outer upper electrode 62 via a filter circuit 112 and a switch 114 and is also connected to the inner upper electrode 60 via the filter circuit 112, a switch 116 and a variable resistor 118. A DC voltage $V_A$ outputted from the variable DC power supply 110 is applied to the outer upper electrode 62 as a second DC voltage $V_E$ without voltage drop, and a DC voltage less than the DC voltage $V_A$ by a voltage drop across the variable resistor 118 from is applied to the inner upper electrode 60 as a first DC voltage $V_C$. Each of the switches 116 and 114 is switched over between a terminal for passing through the output voltage of the variable DC power supply 110 toward corresponding one of the upper electrodes 60 and 62 and a terminal for connecting the corresponding one of the upper electrodes 60 and 62 to a ground potential (that is, applying 0 V).

Figure 16:
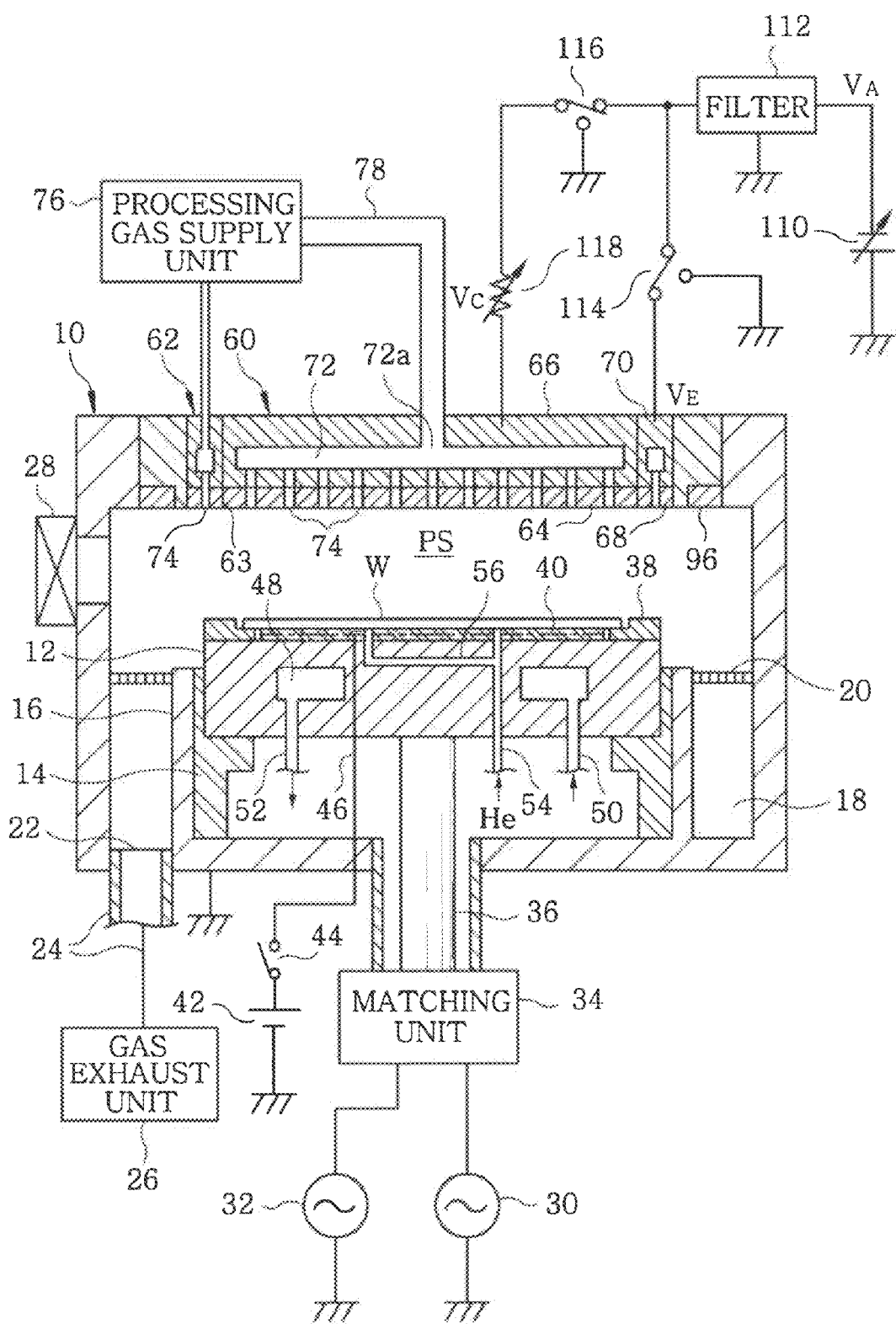
FIG. 16 provides a cross sectional view showing a configuration of a modification example of the capacitively coupled plasma etching apparatus in accordance with the embodiment of the present invention.

Furthermore, in the configuration example illustrated in FIG. 16, a shower head is provided in each of the inner upper electrode 60 and the outer upper electrode 62. It may be also possible to select and control the kinds or flow rates of gases injected from each shower head.

Moreover, the application of the present invention is not limited to the lower electrode dual frequency application type apparatus, but the present invention can be also applied to, e.g., a plasma etching apparatus which applies a first RF power for plasma generation to the upper electrodes 60 and 62.

Furthermore, the present invention is not limited to the plasma etching apparatus, but may be applied to various other plasma processing apparatuses such as a plasma CVD apparatus, a plasma oxidation apparatus, a plasma nitridation apparatus, a sputtering apparatus, or the like. In addition, the substrate to be processed in the present invention is not limited to the semiconductor wafer but may be various substrates for flat panel displays, photo masks, CD substrates, printed circuit boards, and the like.

In accordance with the plasma processing apparatus of the present invention, the distribution characteristic of the electron density or the process characteristics on the substrate to be processed can be easily and arbitrarily control by using the above-described configuration and function.

Moreover, in accordance with the plasma processing method of the present invention, uniformity of etching characteristics in various etching processes can be improved by using the above-described configuration and function.

While the invention has been shown and described with respect to the embodiments, it will be understood by those skilled in the art that various changes and modification may be made without departing from the scope of the invention as defined in the following claims.

What is claimed is:

1. A plasma etching method for performing an etching process on a Si-containing insulating film by using a plasma processing apparatus including a vacuum evacuable processing chamber; a lower electrode for mounting a substrate thereon in the processing chamber; an inner upper electrode provided in the processing chamber to face the lower electrode; an outer upper electrode provided in a ring shape at a radially outside of the inner upper electrode in the processing chamber and electrically isolated from the inner upper electrode; a processing gas supply unit for supplying a processing gas into a processing space between the inner and the outer upper electrode and the lower electrode; a radio frequency (RF) power supply unit for applying an RF power to the lower electrode or the inner and the outer upper electrode to generate a plasma of the processing gas by RF discharge; a first DC power supply unit for applying a first variable DC voltage to the inner upper electrode; and a second DC power supply unit for applying a second variable DC voltage to the outer upper electrode, the plasma etching method comprising:

controlling an etching rate distribution characteristic across a surface of the substrate by varying the second variable DC voltage on the outer upper electrode, while fixing the first variable DC voltage on the inner upper electrode to a specific value, wherein both of the first and the second variable DC voltage are not greater than 0V, and the magnitude of the second variable DC voltage is equal to or greater than the magnitude of the first variable DC voltage.

2. The plasma etching method of claim 1, wherein the insulating film is an $SiO_2$ film; the etching process is a process of forming a contact hole in the $SiO_2$ film; the first variable DC voltage is set in the range from about −600 V to −150 V; and the second variable DC voltage is set in the range from about −1000 V to −150 V.

3. The plasma etching method of claim 2, wherein the plasma processing apparatus further includes an additional RF power supply unit for applying an additional RF power to the lower electrode to attract ions in the plasma towards the substrate, and the frequency of the additional RF power is set to range from about 2 MHz to 3.2 MHz.

4. The plasma etching method of claim 1, wherein the insulating film is an SiOC film; the etching process is a process of forming a via hole in the SiOC film; the first variable DC voltage is set in the range from about −900 V to −300 V; and the second variable DC voltage is set in the range from about −1500 V to −300 V.

5. The plasma etching method of claim 4, wherein the plasma processing apparatus further includes an additional RF power supply unit for applying an additional RF power to the lower electrode to attract ions in the plasma towards the substrate, and the frequency of the additional RF power is set to range from about 10 MHz to 13.56 MHz.

6. The plasma etching method of claim 1, wherein the processing gas is an etching gas containing a fluorocarbon gas; an inert gas; and one of an $O_2$ gas and an $N_2$ gas.

7. The plasma etching method of claim 1, wherein the insulating film is an SiN film used as an intermediate or a lower most layer of a multilayer resist; the etching process is a process of forming an SiN mask for use in etching a base film or a base substrate disposed thereunder; the first variable DC voltage is set in the range from about −300 V to 0 V; and the second variable DC voltage is set in the range from about −900 V to −300V.

8. The plasma etching method of claim 7, wherein the plasma processing apparatus further includes an additional RF power supply unit for applying an additional RF power to the lower electrode to attract ions in the plasma towards the substrate, and the frequency of the additional RF power is set to range from about 10 MHz to 13.56 MHz.

9. A plasma etching method for etching an organic film by using a plasma processing apparatus including a vacuum evacuable processing chamber; a lower electrode for mounting a substrate thereon in the processing chamber; an inner upper electrode provided in the processing chamber to face the lower electrode; an outer upper electrode provided in a ring shape at a radially outside of the inner upper electrode in the processing chamber and electrically isolated from the inner upper electrode; a processing gas supply unit for supplying a processing gas into a processing space between the inner and the outer upper electrode and the lower electrode; a radio frequency (RF) power supply unit for applying an RF power to the lower electrode or the inner and the outer upper electrode to generate a plasma of the processing gas by RF discharge; a first DC power supply unit for applying a first variable DC voltage to the inner upper electrode; and a second DC power supply unit for applying a second variable DC voltage to the outer upper electrode, the plasma etching method comprising:

controlling an etching rate distribution characteristic across a surface of the substrate by varying the second variable DC voltage on the outer upper electrode, while fixing the first variable DC voltage on the inner upper electrode to a specific value, wherein both of the first and the second variable DC voltage are not greater than 0V, and the magnitude of the second variable DC voltage is equal to or greater than the magnitude of the first variable DC voltage.

10. The plasma etching method of claim 9, wherein the first variable DC voltage is set in the range from about −100 V to 0 V; and the second variable DC voltage is set in the range from about −900 V to 0 V.

11. The plasma etching method of claim 10, wherein the plasma processing apparatus further includes an additional RF power supply unit for applying an additional RF power to the lower electrode to attract ions in the plasma towards the substrate, and the frequency of the additional RF power is set to range from about 10 MHz to 13.56 MHz.

12. The plasma etching method of claim 9, wherein the processing gas is an etching gas containing an $O_2$ gas or an $N_2$ gas.

* * * * *